(12) United States Patent
Kurahori et al.

(10) Patent No.: US 11,881,789 B2
(45) Date of Patent: Jan. 23, 2024

(54) POWER CONVERSION APPARATUS

(71) Applicant: Mitsubishi Electric Corporation, Tokyo (JP)

(72) Inventors: Takahiro Kurahori, Tokyo (JP); Tatsuki Matsunaga, Tokyo (JP); Norikazu Hattori, Tokyo (JP); Shohei Suzuki, Tokyo (JP); Yasuo Fujii, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 12 days.

(21) Appl. No.: 17/633,214

(22) PCT Filed: Nov. 28, 2019

(86) PCT No.: PCT/JP2019/046597
§ 371 (c)(1),
(2) Date: Feb. 7, 2022

(87) PCT Pub. No.: WO2021/106150
PCT Pub. Date: Jun. 3, 2021

(65) Prior Publication Data
US 2022/0311348 A1    Sep. 29, 2022

(51) Int. Cl.
*H05K 5/03*    (2006.01)
*H02M 7/00*    (2006.01)

(52) U.S. Cl.
CPC .............. *H02M 7/003* (2013.01); *H05K 5/03* (2013.01)

(58) Field of Classification Search
CPC ........ H02M 7/003; H05K 5/03; H05K 5/0008
See application file for complete search history.

(56) References Cited

U.S. PATENT DOCUMENTS 8,422,222 B2 *  4/2013  Noda ................. H05K 7/14329
                                                361/689
2011/0280056 A1 * 11/2011  Noda ................. H05K 7/14329
                                                363/146
(Continued)

FOREIGN PATENT DOCUMENTS

JP        2011-109846 A     6/2011
JP         5609408 B2 *    10/2014
(Continued)

OTHER PUBLICATIONS

Translation of JP-6213150-B2 (Year: 2017).*
(Continued)

*Primary Examiner* — Abhishek M Rathod
*Assistant Examiner* — Keith DePew
(74) *Attorney, Agent, or Firm* — XSENSUS LLP

(57) ABSTRACT

The inverter includes: a main body case accommodating main circuit terminal block and a control terminal block, high-voltage wire and low-voltage wire being respectively connected to the main circuit terminal block and the control terminal block; a wire cover detachably attached to the main body case to cover the main circuit terminal block; and a front cover detachably attached to the wire cover to cover the control terminal block, the front cover being fixed to the main body case with a fastening member requiring a tool for removal. The front cover includes a stopper, and, in a state where the front cover is attached to the wire cover, the stopper is located on a path through which the wire cover moves when removing the wire cover from the main body case.

15 Claims, 13 Drawing Sheets

(56) References Cited

U.S. PATENT DOCUMENTS

2017/0155336 A1* 6/2017 Yamazawa ......... H05K 7/14322
2021/0167694 A1* 6/2021 Tonomoto .......... H05K 7/14329

FOREIGN PATENT DOCUMENTS

| JP | 2016-152766 | A | | 8/2016 |
| JP | 6213150 | B2 | * | 10/2017 |
| JP | 2018-206919 | A | | 12/2018 |
| KR | 100190154 | B1 | * | 6/1999 |

OTHER PUBLICATIONS

Translation of KR-100190154-B1 (Year: 1999).*
Translation of JP-5609408-B2 (Year: 2014).*
International Search Report and Written Opinion dated Feb. 4, 2020, received for PCT Application PCT/JP2019/046597, Filed on Nov. 28, 2019, 8 pages including English Translation.

* cited by examiner

POWER CONVERSION APPARATUS

CROSS-REFERENCE TO RELATED APPLICATION

The present application is based on PCT filing PCT/JP2019/046597, filed Nov. 28, 2019, the entire contents of which are incorporated herein by reference.

FIELD

The present invention relates to a power conversion apparatus that performs conversion of electric energy such as conversion of alternating current to direct current, conversion of direct current to alternating current, alternating-current frequency conversion, or direct-current power conversion.

BACKGROUND

In power conversion apparatuses such as inverters, high-voltage wires for main circuits and low-voltage wires for control are connected. The high-voltage wire and the low-voltage wire are respectively connected to different terminal blocks. A protection cover is attached to the power conversion apparatus so that people are prevented from accidentally touching a high-voltage wire connection portion. As disclosed in Patent Literature 1, the protection cover is configured such that it is fixed by fastening members and thus cannot be removed without using a tool.

CITATION LIST

Patent Literature

Patent Literature 1: Japanese Patent Application Laid-open No. 2011-109846

SUMMARY

Technical Problem

In the invention disclosed in Patent Literature 1, the high-voltage wire connection portion and the low-voltage wire connection portion are covered with one cover. Accordingly, when the cover is removed to perform a low-voltage wire connection work, the high-voltage wire connection portion is also exposed. Thus, when the low-voltage wire connection work is performed, it is necessary to pay attention not to touch the high-voltage wire connection portion. This makes it difficult to perform the low-voltage wire connection work.

If the structure is such that a cover to cover only the low-voltage wire connection portion is provided separately from a cover to cover the high-voltage wire connection portion, the low-voltage wire connection work is performed in a state where only the cover to cover only the low-voltage wire connection portion is removed. Thus, it is possible to prevent the high-voltage wire connection portion from being accidentally touched. However, when the connection work or inspection for both the high-voltage wire and the low-voltage wire is performed, fastening members fixing the respective two covers need to be removed separately using a tool. In other words, when the connection work or inspection for both the high-voltage wire and the low-voltage wire is performed, it is necessary to perform a work of removing a fastening member using a tool twice, which reduces the ease of the connection work or inspection.

The present invention has been achieved in view of the above and an object of the present invention is to provide a power conversion apparatus that includes a cover to cover only a low-voltage wire connection portion separately from a cover to cover a high-voltage wire connection portion, and that is capable of exposing the high-voltage wire connection portion and the low-voltage wire connection portion by a single use of a tool, or by using a tool only once.

Solution to Problem

In order to solve the above problems and achieve the object, the present invention includes: a main body case to accommodate a first substrate on which a first terminal block is mounted and a second substrate on which a second terminal block is mounted, a high-voltage wire being connected to the first terminal block, a low-voltage wire being connected to the second terminal block; a first cover detachably attached to the main body case to cover the first terminal block; and a second cover detachably attached to the first cover to cover only the second terminal block of the first terminal block and the second terminal block, the second cover being fixed to the main body case with a fastening member that requires a tool for removal. The second cover includes a stopper, and, in a state where the second cover is attached to the first cover, the stopper is located on a path through which the first cover moves when removing the first cover from the main body case. The first cover and the main body case have a fitting structure in which a projection fits into a hole or a recess when the first cover is attached to the main body case.

Advantageous Effects of Invention

A power conversion apparatus according to the present invention includes a cover to cover only a low-voltage wire connection portion separately from a cover to cover a high-voltage wire connection portion, and produces an effect of being capable of exposing the high-voltage wire connection portion and the low-voltage wire connection portion by a single use of a tool.

DESCRIPTION OF EMBODIMENTS

A power conversion apparatus according to embodiments of the present invention will be explained below in detail with reference to the drawings. The embodiments are not intended to limit this invention.

First Embodiment

Figure 1:
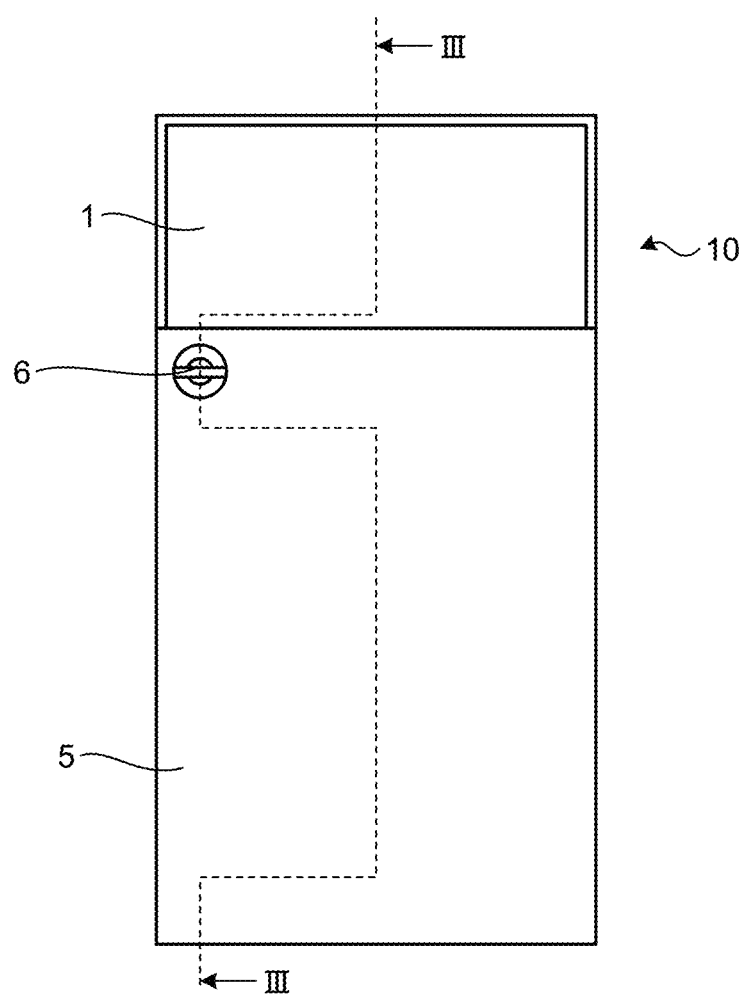
FIG. 1 is a front view of an inverter according to a first embodiment of the present invention.
Figure 2:
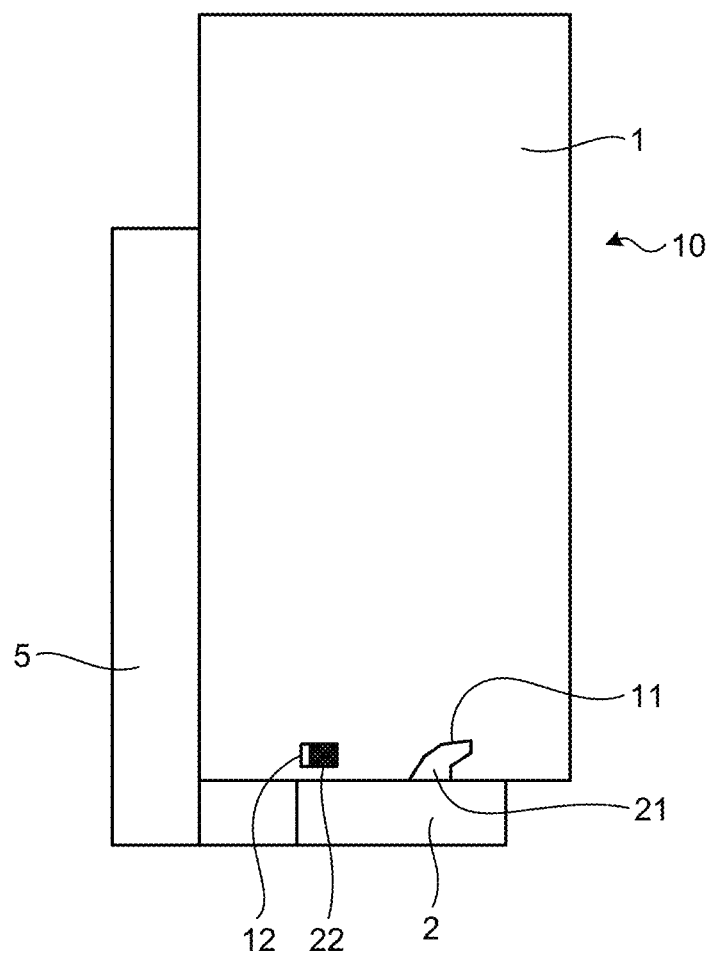
FIG. 2 is a side view of the inverter according to the first embodiment.
Figure 3:
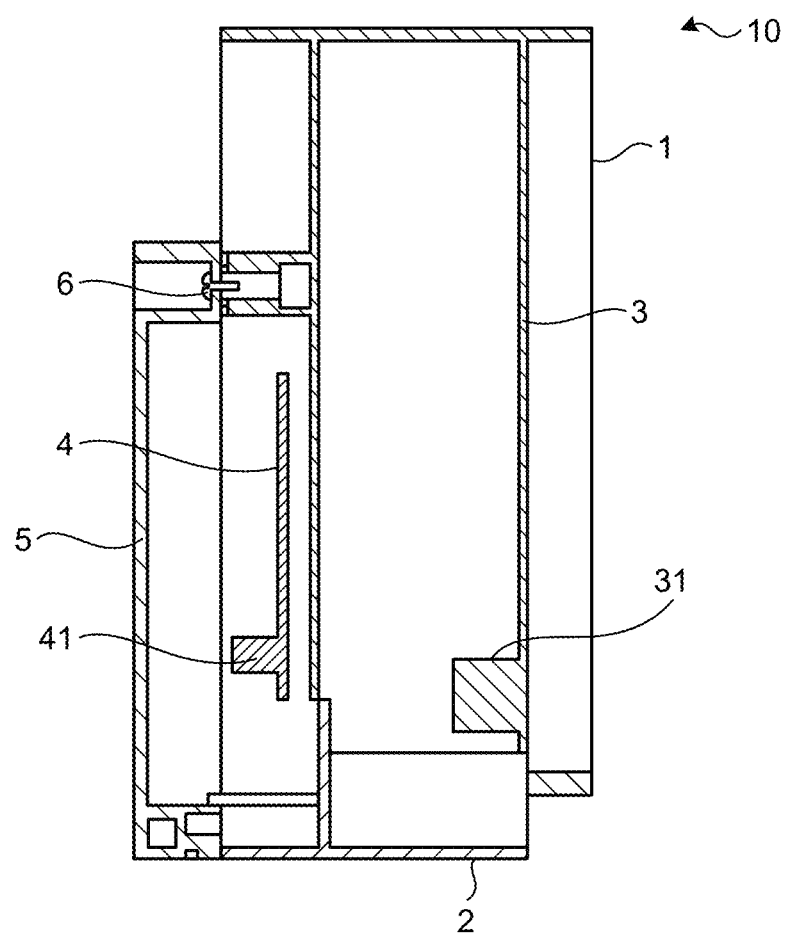
FIG. 3 is a cross-sectional view of the inverter according to the first embodiment.

FIG. 1 is a front view of an inverter according to a first embodiment of the present invention. FIG. 2 is a side view of the inverter according to the first embodiment. FIG. 3 is a cross-sectional view of the inverter according to the first embodiment. FIG. 3 illustrates a cross-section taken along line III-III in FIG. 1. An inverter 10 that is a power conversion apparatus includes a main circuit substrate 3 that is a first substrate and a control substrate 4 that is a second substrate. A main circuit terminal block 31 that is a first terminal block is mounted on the main circuit substrate 3. A control terminal block 41 that is a second terminal block is mounted on the control substrate 4. The inverter 10 further includes: a main body case 1 that accommodates the main circuit substrate 3 and the control substrate 4; a wire cover 2 that is a first cover detachably attached to the main body case 1 to cover the main circuit terminal block 31; and a front cover 5 that is a second cover detachably attached to the wire cover 2 to cover only the control terminal block 41 of the main circuit terminal block 31 and the control terminal block 41, and fixed to the main body case 1. The main body case 1 is box shaped with an opening in each of the front surface and the bottom surface. The front surface is a surface of the inverter 10 that the operator operating the inverter 10 or the worker performing maintenance on the inverter 10 faces. The bottom surface is a surface of the inverter 10 directed vertically downward when the inverter 10 is installed. The wire cover 2 is attached to the bottom surface of the main body case 1. The front cover 5 is attached to the front surface of the main body case 1. The front cover 5 is fixed to the main body case 1 by screwing a screw 6 that is a fastening member that requires a tool for removal, into the main body case 1.

As illustrated in FIG. 2, notches 11 and holes 12 are formed in the side surfaces of the main body case 1. The wire cover 2 is provided with projections 21 and projections 22. The projections 21 engage the notches 11 and the projections 22 fit into the holes 12. Accordingly, the wire cover 2 is fixed to the bottom surface of the main body case 1, and the wire cover 2 cannot be removed from the main body case 1 unless the fitting of the projections 22 and the holes 12 is released. The projections 22 and the holes 12 provide merely a hole-projection fitting; therefore, the fitting can be released without using a tool.

Figure 4:
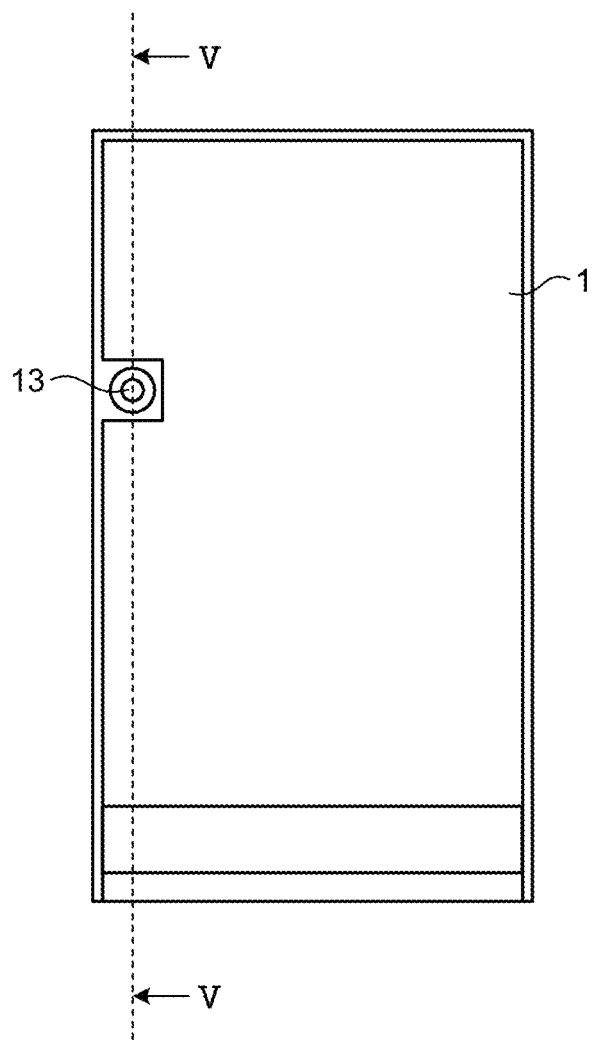
FIG. 4 is a front view of a main body case of the inverter according to the first embodiment.
Figure 5:
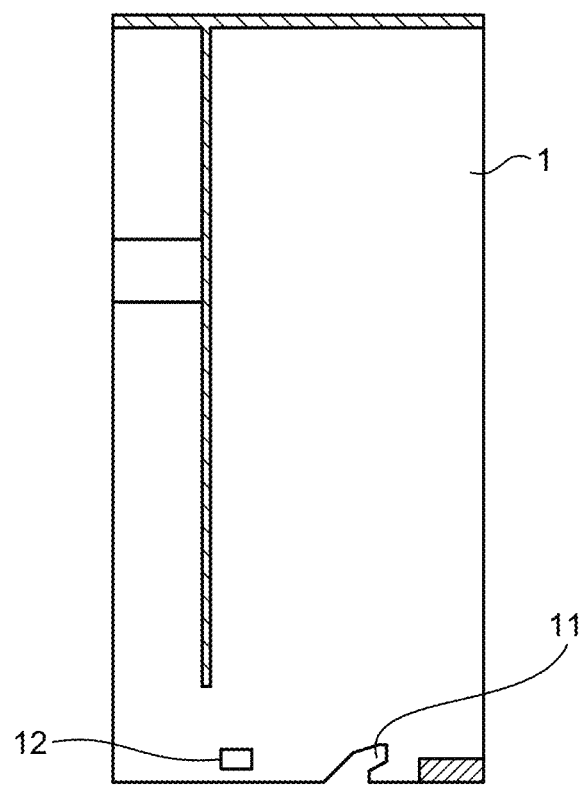
FIG. 5 is a cross-sectional view of the main body case of the inverter according to the first embodiment.

FIG. 4 is a front view of the main body case of the inverter according to the first embodiment. FIG. 5 is a cross-sectional view of the main body case of the inverter according to the first embodiment. FIG. 5 illustrates a cross-section taken along line V-V in FIG. 4. The main body case 1 has a cuboid shape and is hollow. The main body case 1 is formed with the notches 11 and the holes 12 for mating with the wire cover 2. The main body case 1 comes with an internal thread 13 for screwing the front cover 5 to the main body case 1.

Figure 6:
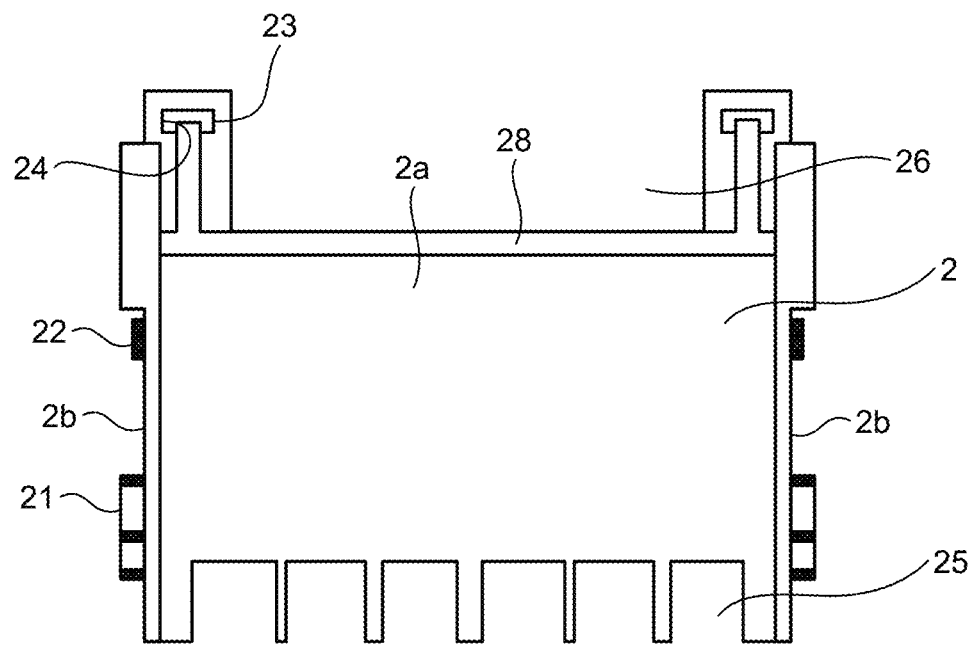
FIG. 6 is a top view of a wire cover of the inverter according to the first embodiment.
Figure 7:
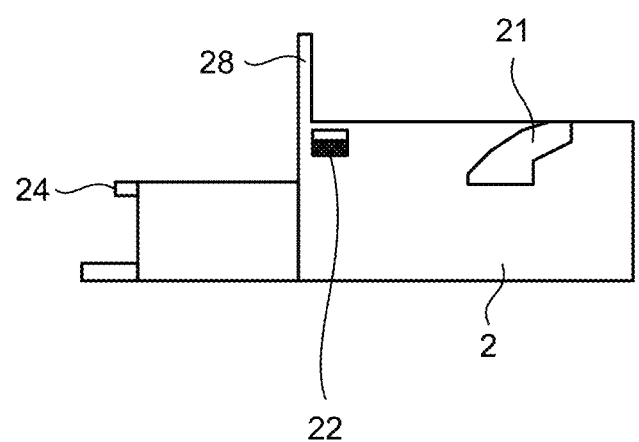
FIG. 7 is a side view of the wire cover of the inverter according to the first embodiment.

FIG. 6 is a top view of the wire cover of the inverter according to the first embodiment. FIG. 7 is a side view of the wire cover of the inverter according to the first embodiment. The wire cover 2 includes a protection plate portion 2a and side wall portions 2b extending vertically from both end portions of the protection plate portion 2a. The protection plate portion 2a has notches 25 and 26 for drawing the high-voltage wire and the low-voltage wire connected to the main circuit terminal block 31 and the control terminal block 41 out of the main body case 1. A partition 28 to separate the high-voltage wire and the low-voltage wire is provided on the top surface of a portion of the protection plate portion 2a between the notch 25 and the notch 26. The projections 21 and the projections 22 for mating with the main body case 1 are provided on the side wall portions 2b. The projections 21 have the same shape as the notches 11 of the main body case 1 illustrated in FIG. 5 and fit into the notches 11 by rotating the wire cover 2. The protection plate portion 2a has holes 23 for mating with the front cover 5. The partition 28 is provided with projections 24 to face the holes 23.

Figure 8:
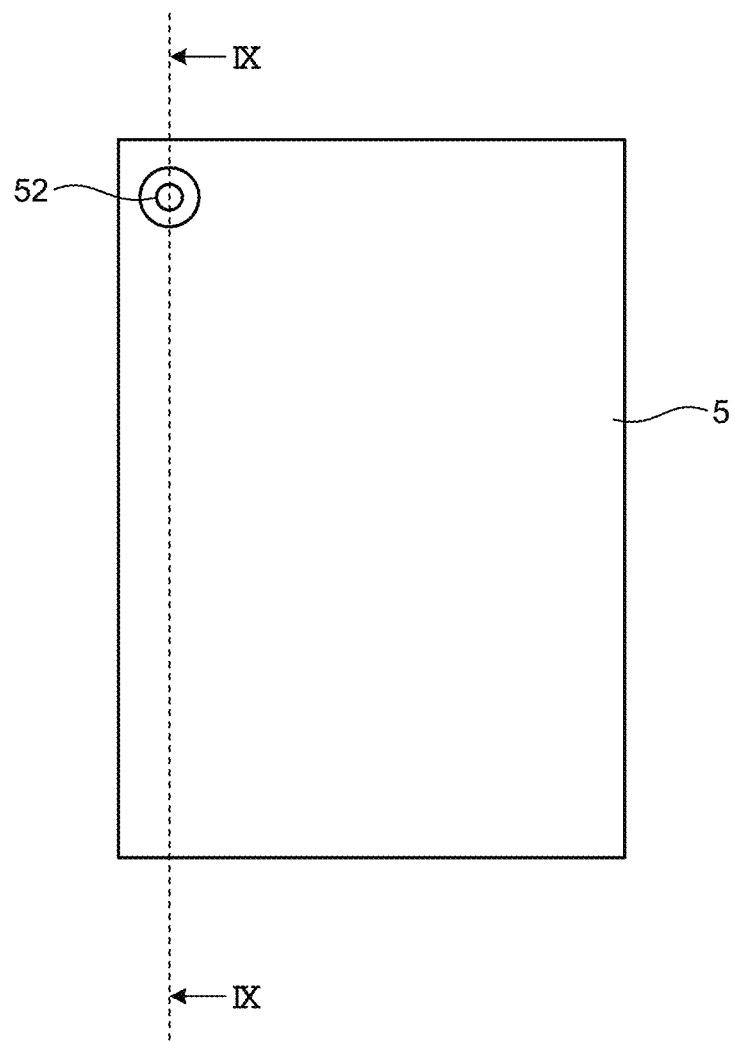
FIG. 8 is a front view of a front cover of the inverter according to the first embodiment.
Figure 9:
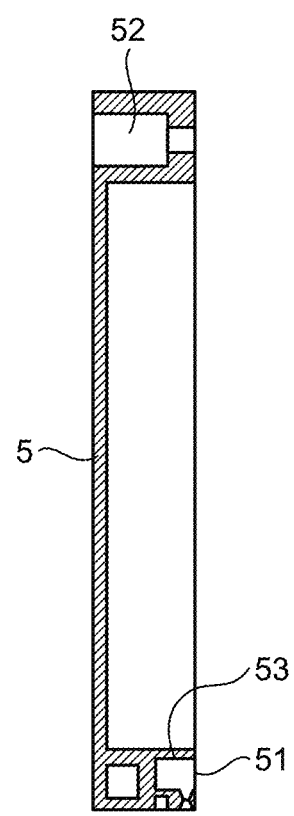
FIG. 9 is a cross-sectional view of the front cover of the inverter according to the first embodiment.

FIG. 8 is a front view of the front cover of the inverter according to the first embodiment. FIG. 9 is a cross-sectional view of the front cover of the inverter according to the first embodiment. FIG. 9 illustrates a cross-section taken along line IX-IX in FIG. 8. The front cover 5 includes claws 51 for mating with the wire cover and is formed with a hole 52 for fixing the front cover 5 to the main body case 1 with the screw 6. The front cover 5 includes a stopper 53 to prevent the removal of the wire cover 2 without using a tool.

Figure 10:
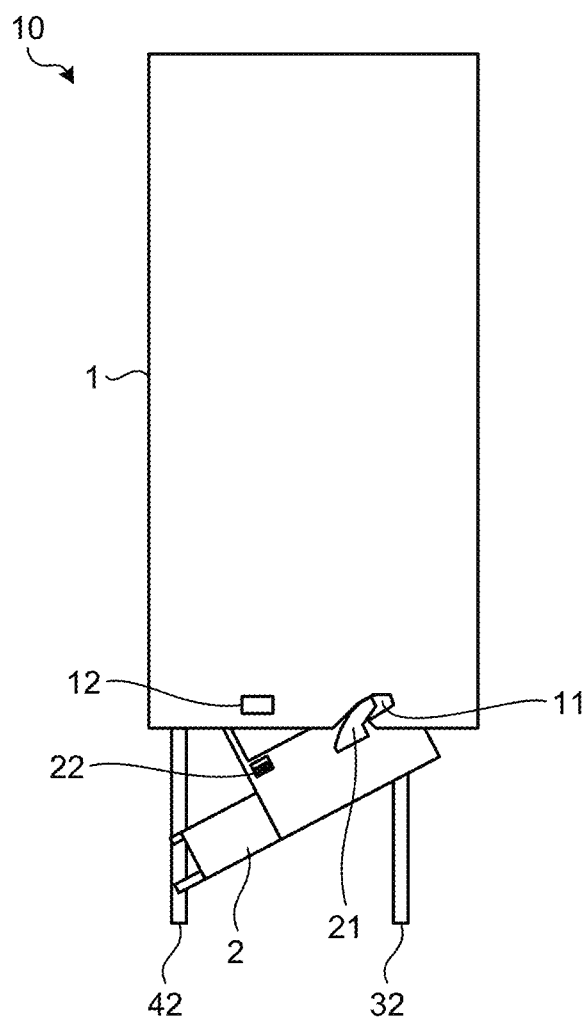
FIG. 10 is a diagram illustrating how the wire cover is attached to the main body case in the inverter according to the first embodiment.
Figure 11:
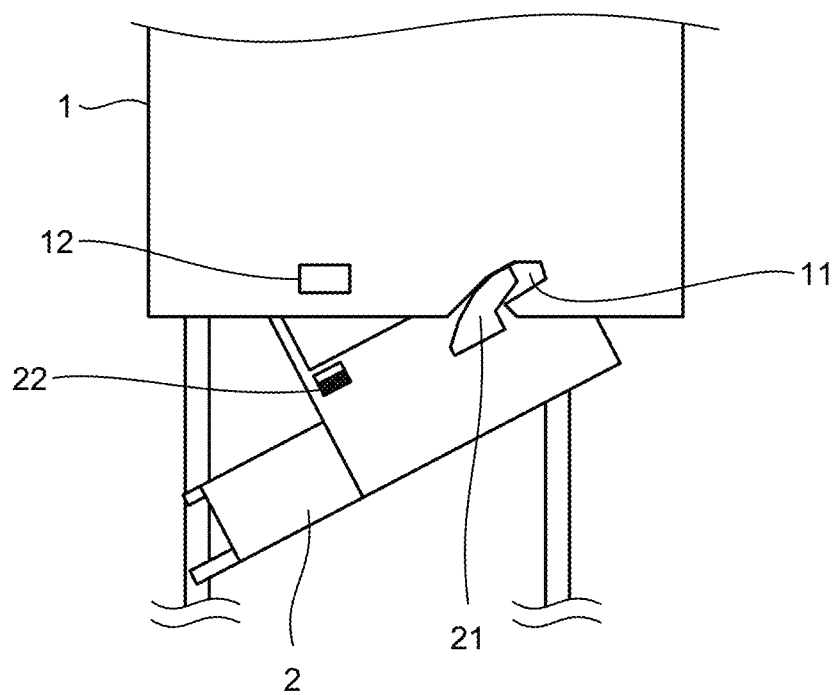
FIG. 11 is an enlarged view of a fitting portion for fitting the main body case and the wire cover together in the inverter according to the first embodiment.

FIG. 10 is a diagram illustrating how the wire cover is attached to the main body case in the inverter according to the first embodiment. FIG. 11 is an enlarged view of the fitting portion for fitting the main body case and the wire cover together in the inverter according to the first embodiment. A high-voltage wire 32 is connected to the main circuit terminal block 31. A low-voltage wire 42 is connected to the control terminal block 41. When the high-voltage wire 32 is connected to the main circuit terminal block 31, the high-voltage wire 32 is drawn out of the main body case 1 through the notch 25 illustrated in FIG. 6. In a similar manner, when the low-voltage wire 42 is connected to the control terminal block 41, the low-voltage wire 42 is drawn out of the main body case 1 through the notch 26 illustrated in FIG. 6. After the high-voltage wire 32 and the low-voltage wire 42 are drawn out of the main body case 1, the projections 21 of the wire cover 2 are inserted into the notches 11 of the main body case 1 and the wire cover 2 is rotated along the notches 11, so that the projections 22 of the wire cover 2 fit into the holes 12 of the main body case 1. As described above, the wire cover 2 and the main body case 1 have a fitting structure in which a projection fits into a hole when the wire cover 2 is attached to the main body case 1. Thus, when the wire cover 2 is attached to the main body case 1, the holes 12 of the main body case 1 and the projections 22 of the wire cover 2 fit together. In the manner as described above, the wire cover 2 is attached to the main body case 1.

Figure 12:
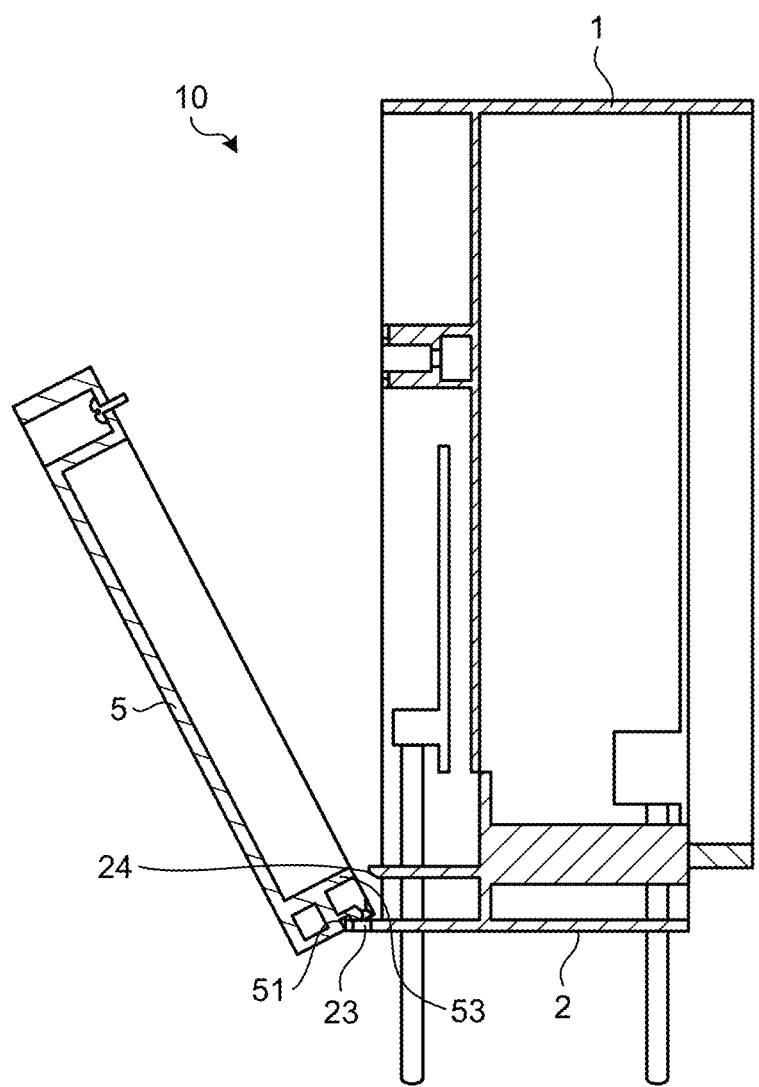
FIG. 12 is a diagram illustrating how the front cover is attached to the wire cover in the inverter according to the first embodiment.
Figure 13:
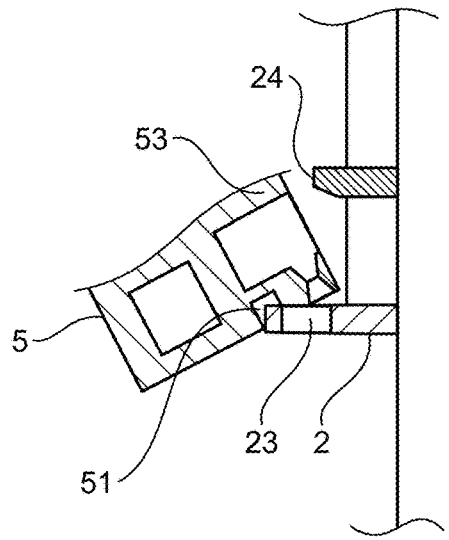
FIG. 13 is an enlarged view of a fitting portion for fitting the wire cover and the front cover together in the inverter according to the first embodiment.

Next, the front cover 5 is attached to the wire cover 2. FIG. 12 is a diagram illustrating how the front cover is attached to the wire cover in the inverter according to the first embodiment. FIG. 13 is an enlarged view of the fitting portion for fitting the wire cover and the front cover together in the inverter according to the first embodiment. The claws 51 of the front cover 5 are inserted into the holes 23 of the wire cover 2 and the front cover 5 is rotated about the claws 51, so that the front cover 5 is attached to the wire cover 2. Finally, the screw 6 that has passed through the hole 52 of the front cover 5 is threaded into the main body case 1 using a tool to fix the wire cover 2 and the front cover 5 to the main body case 1.

Figure 14:
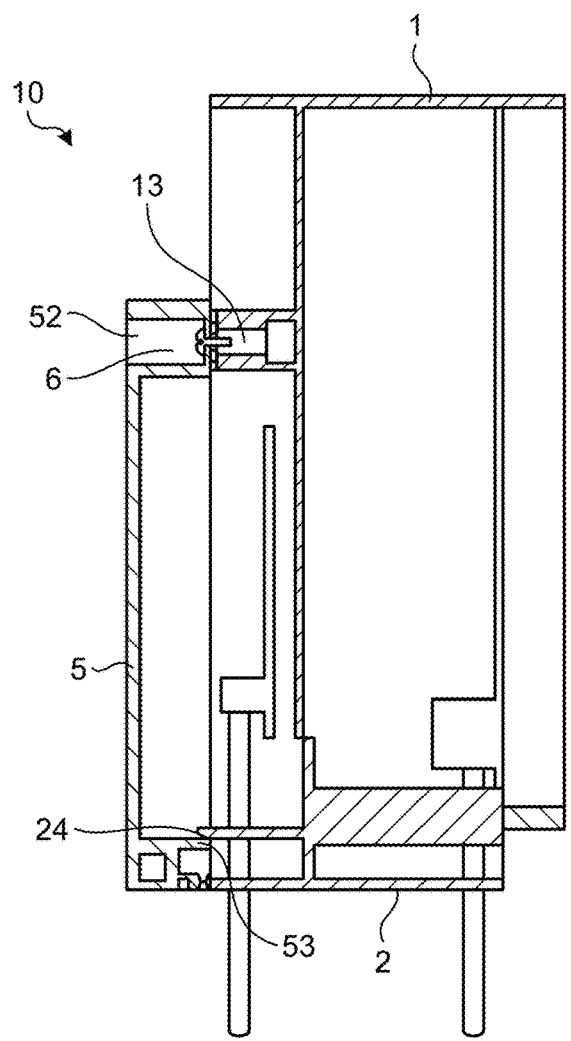
FIG. 14 is a diagram illustrating a state where the wire cover and the front cover are fixed to the main body case in the inverter according to the first embodiment.
Figure 15:
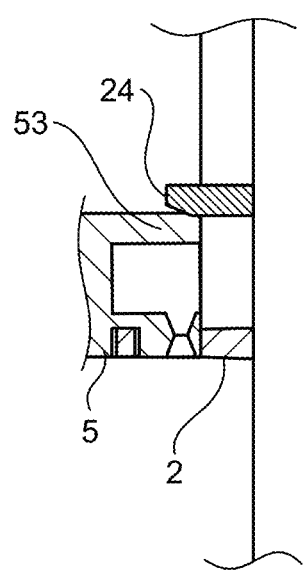
FIG. 15 is an enlarged view of the fitting portion for fitting the wire cover and the front cover together in the inverter according to the first embodiment.

FIG. 14 is a diagram illustrating a state where the wire cover and the front cover are fixed to the main body case in the inverter according to the first embodiment. FIG. 15 is an enlarged view of the fitting portion for fitting the wire cover and the front cover together in the inverter according to the first embodiment. In the state where the front cover 5 is fixed to the main body case 1 with a screw, the stopper 53 of the front cover 5 is present on the path through which the projections 24 of the wire cover 2 passes when removing the wire cover 2 from the main body case 1. Thus, the wire cover 2 cannot be removed from the main body case 1 as long as the front cover 5 is fixed to the main body case 1 with the screw 6.

In the case of removing the wire cover 2 from the main body case 1, the work is performed in reverse order to the attachment work described above.

In the inverter 10 according to the first embodiment, the front cover 5 is fixed to the main body case 1 with the screw 6, so that the front cover 5 cannot be removed without using a tool. On the other hand, the wire cover 2 is fixed to the main body case 1 simply by engaging the projections 21 with the notches 11 and by fitting the projections 22 into the holes 12; therefore, the wire cover 2 alone can be attached to or detached from the main body case 1 without performing a work of tightening or removing a fastening member using a tool. However, in the state where the front cover 5 is attached, the stopper 53 of the front cover 5 interfaces with the projections 24 of the wire cover 2 and thus the wire cover 2 cannot be rotated. Thus, when the front cover 5 is fixed to the main body case 1 with the screw 6, neither the front cover 5 nor the wire cover 2 can be removed.

The inverter 10 according to the first embodiment enables the front cover 5 and the wire cover 2 to be attached or detached by performing a work that requires a tool for removing the screw 6 fixing the front cover 5 to the main body case 1 only once. Thus, the connection work or inspection for the high-voltage wire 32 and the low-voltage wire 42 can be performed efficiently. Moreover, when it is not necessary to expose the connection portion 20 of the high-voltage wire 32, only the front cover 5 is removed and the wire cover 2 remains attached. Thus, when the connection work or inspection for only the low-voltage wire 42 is performed, it is possible to prevent the connection portion of the high-voltage wire 32 from being accidentally touched.

In the above description, the wire cover 2 and the front cover 5 are rotated for attachment and detachment; however, at least one of the wire cover 2 and the front cover 5 may be slid for attachment or detachment. In the state where the front cover 5 is attached to the wire cover 2, the stopper 53 is located on the path through which the wire cover 2 moves when the wire cover 2 is slid. Thus, the wire cover 2 cannot be removed from the main body case 1 as long as the front cover 5 remains fixed to the main body case 1 with a screw; therefore, it is possible to prevent the wire cover 2 from being removed without using a tool and prevent the main circuit terminal block 31 from being exposed.

In the embodiment described above, the fitting structure of the wire cover 2 and the main body case 1 is such that the projections 22 of the wire cover 2 fit into the holes 12 of the main body case 1; however, the fitting structure of the wire cover 2 and the main body case 1 may be such that the main body case 1 has a projection and the wire cover 2 has a hole or a recess. Moreover, in the embodiment described above, the main body case 1 is box shaped with an opening in each of the front surface and the bottom surface, the first cover is attached to the lower surface of the main body case 1, and the second cover is attached to the front surface of the main body case; however, the main body case 1 may be box shaped with an opening in a surface other than the front surface or the bottom surface. Therefore, the surfaces to which the first cover and the second cover are attached are not limited to the front surface and the bottom surface.

The configurations described in the above embodiments show examples of the content of the present invention. The configurations can be combined with other well-known techniques, and can be partly omitted or modified without departing from the scope of the present invention.

REFERENCE SIGNS LIST 1 main body case; 2 wire cover; 2a protection plate portion; 2b side wall portion; 3 main circuit substrate; 4 control substrate; 5 front cover; 6 screw; 10 inverter; 11, 25, 26 notch; 12, 23, 52 hole; 13 internal thread; 21, 22, 24 projection; 28 partition; 31 main circuit terminal block; 32 high-voltage wire; 41 control terminal block; 42 low-voltage wire; 51 claw; 53 stopper.

The invention claimed is:

1. A power conversion apparatus comprising:
a main body case to accommodate a first terminal block and a second terminal block, a high-voltage wire being connectable to the first terminal block, and a low-voltage wire being connectable to the second terminal block;
a first cover detachably attached to the main body case to cover the first terminal block; and
a second cover detachably attached to the first cover to cover the second terminal block, the second cover being fixable to the main body case with a fastener, wherein
the second cover includes a stopper, and, in a state where the second cover is detachably attached to the first cover, the stopper is on a path through which the first cover moves when removing the first cover from the main body case, and the second cover prevents removal of the first cover from the main body case.

2. The power conversion apparatus according to claim 1, wherein the first cover has notches through which the high-voltage wire and the low-voltage wire respectively pass and are connectable to the first terminal block and the second terminal block, respectively.

3. The power conversion apparatus according to claim 2, wherein
the main body case is box shaped with an opening in each of a front surface and a bottom surface,
the first cover is attached to the bottom surface of the main body case, and
the second cover is attached to the front surface of the main body case.

4. The power conversion apparatus according to claim 1, wherein the main body case is box shaped with an opening in each of a front surface and a bottom surface, the first cover is attached to the bottom surface of the main body case, and the second cover is attached to the front surface of the main body case.

5. The power conversion apparatus according to claim 1, wherein the first cover and the main body case have a fitting structure in which a projection fits into a hole or a recess when the first cover is attached to the main body case.

6. The power conversion apparatus according to claim 5, wherein the first cover has notches through which the high-voltage wire and the low-voltage wire respectively pass.

7. The power conversion apparatus according to claim 6, wherein the main body case is box shaped with an opening in each of a front surface and a bottom surface, the first cover is attached to the bottom surface of the main body case, and the second cover is attached to the front surface of the main body case.

8. The power conversion apparatus according to claim 5, wherein the main body case is box shaped with an opening in each of a front surface and a bottom surface, the first cover is attached to the bottom surface of the main body case, and the second cover is attached to the front surface of the main body case.

9. The power conversion apparatus according to claim 1, wherein the path through which the first cover moves when removing the first cover from the main body case is in the form an arc.

10. The power conversion apparatus according to claim 1, wherein the second cover must be rotated away from the main body case for detachment of the second cover from the first cover.

11. The power conversion apparatus according to claim 1, wherein the fastener extends into the second cover and the main body case to fix the second cover to the main body case without extending into the first cover.

12. The power conversion apparatus according to claim 1, wherein the first cover is removable from the main body case only when the second cover has already been at least partially removed from the main body case.

13. The power conversion apparatus according to claim 1, wherein the second cover being fixed to the main body case with the fastener, and the fastener requires a tool for removal thereof.

14. The power conversion apparatus according to claim 1, wherein the main body case has a notch and a hole, the first cover includes a first projection and a second projection, and the first cover is attached to the main body case by inserting the first projection into the notch, rotating the first cover along the notch, and fitting the second projection into the hole of the main body case.

15. The power conversion apparatus according to claim 1, wherein the second cover directly covers the second terminal block, the first cover directly covers the first terminal block, and the first cover is free of any fasteners, including said fastener to fix the second cover to the main body case, for removal thereof from the main body case.

* * * * *